United States Patent [19]

Denk et al.

[11] 4,447,742
[45] May 8, 1984

[54] DEVICE FOR GENERATING AN ELECTRIC TRIGGER PULSE

[75] Inventors: Heimo Denk, Feldbach; Peter Mantsch; Werner Moser, both of Graz, all of Austria

[73] Assignee: Hans List, Graz, Austria

[21] Appl. No.: 321,046

[22] Filed: Nov. 13, 1981

[30] Foreign Application Priority Data

Nov. 28, 1980 [AT] Austria ............................ 5836/80

[51] Int. Cl.³ .................................................. H03K 3/00
[52] U.S. Cl. ........................................ 307/106; 307/116; 324/72
[58] Field of Search .................. 307/106, 116; 324/72

[56] References Cited

U.S. PATENT DOCUMENTS 4,087,700  5/1978  Curiger et al. ..................... 307/116
4,219,740  8/1980  Little ................................... 307/116

Primary Examiner—E. A. Goldberg
Assistant Examiner—Derek Jennings
Attorney, Agent, or Firm—Watson, Cole, Grindle & Watson

[57] ABSTRACT

A partitioning circuit will partition into subintervals the time interval between two signals delivered by a recognition circuit, and will activate a gate circuit during one of these intervals which has been predetermined. In addition to the recognition circuit, the sequence of signals from a sensor responding to the occurrence of an at least approximately periodic event, is fed to a comparator circuit which will transmit a pulse to the gate circuit each time a certain signal level has been exceeded. If the gate is active, this pulse will be available for further processing.

4 Claims, 1 Drawing Figure

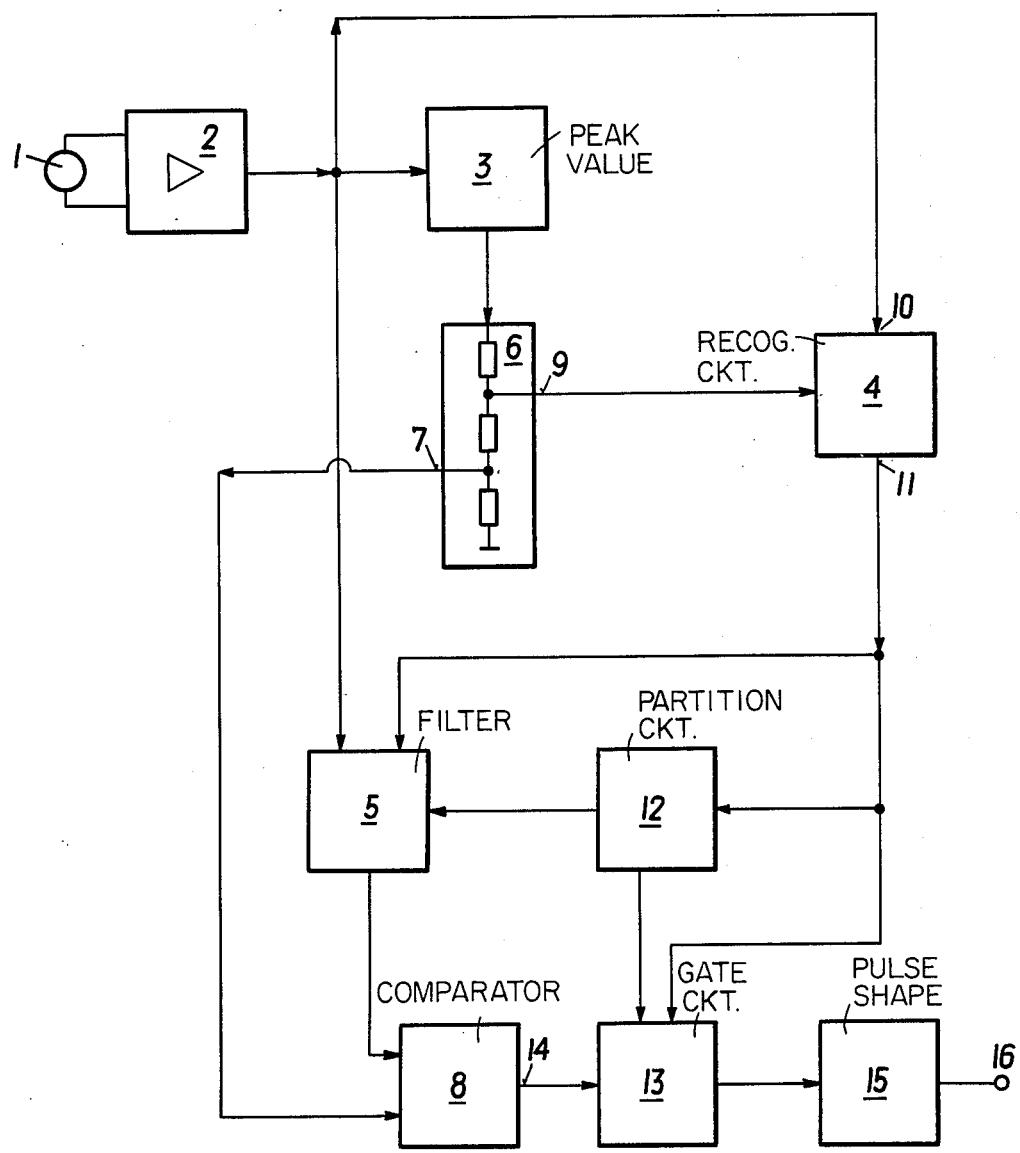

DEVICE FOR GENERATING AN ELECTRIC TRIGGER PULSE

BACKGROUND OF THE INVENTION

The present invention relates to a device for the generation of an electric pulse corresponding to the occurrence in time of an at least approximately periodic event, comprising at least one sensor responding to the occurence of the event, which will feed a sequence of electric signals to an evaluation unit which in turn comprises a recognition circuit for delivering a stable recognition signal uncontaminated by noise upon arrival of the sensor signals; the occurence of the recognition signal will trigger a gate circuit whose output will furnish the pulse corresponding to the occurence of the periodic event.

Such devices are intended for evaluating the sequence of electric signals delivered by the sensor on the occurrence of the event in such a way as to permit the determination of a trigger point corresponding to the occurence of the event in time, which for further processing is taken to define the point in time of the occurrence of the event. Depending on the type of the characteristic event as well as on various external influences on the overall measuring set-up, the sequence of sensor signals is characterized by a particular amplitude distribution over time.

DESCRIPTION OF THE PRIOR ART

Devices of this type, which are used e.g. for determining the beginning of fuel injection of internal combustion engines, are usually provided with a comparator in the evaluation unit for the recognition task, one input of which is fed with the signal arriving from the sensor, while the other one is fed with a reference signal of a known level. When the level of the reference signal has been surpassed by that of the sensor signal, the comparator transmits an output signal for further use which indicates that the desired trigger level has been reached. In addition to the signal proper indicating the occurrence of the event to be detected, the sequence of signals from the sensor will contain noise which consists both of true noise signals occurring independently of the event to be detected, and of signals which are caused by the effect to be measured but have no direct bearing on the event itself. For this reason, the threshold of the comparator used for recognition of the occurrence of the event is usually set to a level which is not reached by the above mentioned noise signals. In such cases it will be impossible to place the trigger point at the beginning of the event to be detected, i.e. at the base of the sensor signal slope, as the noise signals cannot be recognized as such by the evaluation unit, or rather by the recognition unit. Since the noise signals mentioned above may attain even higher levels than the measurement signal proper, devices of the known type can only be used with practically noise-free measurement signals, as it is with signal sequences of this kind only that the threshold of the recognition unit can be chosen freely.

German laid open print No. 23 47 800 describes a device for the generation of an electric signal corresponding to a periodic event, in which (a) a signal derived from the sensor signal is fed to a gate circuit and will activate it whenever a certain signal level has been crossed, and (b) a signal corresponding to a certain characteristic of the sensor signal, i.e. to the sign-change taking place in the middle of the signal, is also transmitted to the gate circuit, which circuit, upon activation, will deliver the signal corresponding to the sign-change at its output. This device cannot be used for precise determination of the actual beginning of the periodic event, or rather of the sinusoidal signal, however, as it does not permit the elimination of noise at the beginning of the signal, and the whole set-up suffers from too great a time delay.

SUMMARY OF THE INVENTION

It is an object of the present invention to improve a device of the aforementioned type in such a way as to eliminate the above disadvantages and to permit determination of the beginning of the event to be detected even if the sensor signals are heavily noise-contaminated.

According to the invention this is achieved by additionally providing the evaluation unit with a partitioning circuit and a comparator; the partitioning circuit following the recognition circuit will partition into subintervals the time interval between two recognition signals and will activate the gate circuit in one of these subintervals which has been predetermined. The sequence of signals from the sensor is fed to the comparator which will transmit an electric pulse to the gate circuit whenever a certain signal level has been exceeded; if the gate is active, this pulse will be available for further processing. During this process use is made of the fact that in most measuring tasks of this type the noise amplitudes tend to be very small during an appropriately short time interval before the beginning of the periodic event to be detected, which will permit the use of a comparator circuit comprising a voltage comparator whose threshold is low enough for the generated trigger pulse to be placed in the initial phase of the approximately periodic event to be detected. In order to prevent noise signals, which may occur at a point in time outside of the small time interval containing the occurrence of the event to be detected, from producing a trigger pulse, the gate circuit generates a very small "window" around the point in time of the expected occurrence of the event, within which the switching pulses which may arrive from the additional comparator circuit will be accepted and outside of which they will be suppressed. For the generation of this window the gate circuit is activated by the partitioning circuit which partitions the time interval betwen two succeeding periodic events into subintervals. This time interval is derived from recognition signals arriving via a recognition circuit, which circuit may e.g. work on the abovementioned principle and may have a switching level exceeding the signal level of the noise signals occurring. The subinterval during which the gate is activated is chosen so as to incorporate the beginning of the periodic (or at least approximately periodic) event, which is of course rougly known. The additional comparator which is independent of the recognition circuit governing the partitioning circuit, may be set to a threshold level just above that of the noise signals which may also occur during this subinterval-though at a very low level only-thus keeping the deviation of the pulse corresponding to the beginning of the periodic event to be detected from the actual beginning of this event negligibly small.

In order to be able to generate a pulse corresponding to the beginning of the event even in cases of a somewhat greater deviation from periodicity of the event to be detected, an enhanced version of the present invention proposes the additional activation of the gate circuit in at least one other subinterval of the time elapsing between two recognition signals, which should be larger than the first. In this context another proposal will be particularly advantageous which suggests to incorporate an electronic filter with a variable time constant between sensor and comparator, whose time constant during the additional activation of the gate is increased as compared to that given during the first, shorter subinterval. Thus, in addition to the first window furnished by the gate circuit, which is relatively narrow, provisions are made for at least one further, somewhat wider window, the danger that trigger pulses signifying the beginning of the periodic event will be produced by noise signals during the longer activation time of the gate circuit being eliminated by the electronic filter. By means of this filter with its increased time constant the noise-derived signals within the wider window can be kept so small as to remain below the threshold of the comparator circuit where they will not generate any trigger pulse.

Since suppressing the noise signals within the wider window by means of the time constant of the filter will of course lead to a time delay of the trigger pulse finally generated by the occurrence of the event, one particularly favorable variant of the present invention envisages that the time constant of the electronic filter can be modified, at least during the additional, greater subinterval, depending on how frequently the periodic event will occur. In this way the timing error induced by the filter delay can be kept optimally small.

In the case of events deviating from periodicity not too strongly, operating with one single window will be quite sufficient; it may, however, prove useful even in this case to provide a filter for the signals delivered to the comparator which is controlled by the frequency of the events, although its frequency-dependent time constant should be kept so small as to make the real-time error of the generated trigger pulse practically negligible.

DESCRIPTION OF A PREFERRED EMBODIMENT

Following is a more detailed description of an exemplary embodiment of the invention as illustrated by the enclosed block diagram.

A sensor 1 responding to the occurrence of an at least approximately periodic event not to be further specified in this context, is connected to a peak value register 3, a recognition circuit 4 and an electronic filter 5 by way of a signal processing circuit 2 comprising an amplifier and, possibly, electronic filters. The output of the peak value register 3 is connected to a voltage divider 6 whose outputs 7 and 9, respectively, will deliver reference voltages for a comparator circuit 8 and the recognition circuit 4, respectively. In the variant illustrated here, the reference voltages at outputs 7 and 9 of the voltage divider 6 will always amount to a predetermined constant percentage of the maximum signal voltage of the sensor 1 delivered via the peak value register 3; e.g. output 7 will deliver 10% of the peak value of the sensor signal, and output 9 will deliver 50% of this peak value.

The recognition circuit 4 is designed such that a trigger pulse will be available at output 11 if the level of the reference voltage delivered via output 9 of the voltage divider 6 is exceeded by the sensor signal applied to input 10. The trigger pulse will correspond to the occurrence in time of the event to be detected by the sensor 1. Basically, this may be achieved by a simple voltage comparator; it will also be possible to use a circuit of the kind disclosed in German laid out print No. 28 15 524, which will take care of any noise contained in the sequence of signals delivered by the sensor.

Although the signal obtained from output 11 of the recognition circuit 4 is directly correlated to the occurrence of the event to be detected on account of the comparatively high reference voltage level suppressing noise in the signal sequence, this comparatively high threshold level has a grave disadvantage, i.e. the appropriate trigger pulse will not be generated at the beginning of the event to be detected, but will be produced rather late, at a time when the signal level is high enough to rule out interference by noise. The recognition signals obtained periodically from output 11 of the recognition circuit 4 on the occurrence of the event to be detected, are fed to a partitioning circuit 12, where they are used for partitioning the interval periods of the recognition signals into predetermined subintervals. The period between two recognition signals may be partitioned by means of a phase control circuit, e.g., or with other known analogue or digital methods, the number of partitions being freely selectable. In the case of periodic events occurring in connection with rotational motion, e.g., partitioning circuits have proved successful which partition the time elapsing between successive events into 360 parts or an integer multiple thereof, since this will permit immediate statements concerning the angle of the event to occur. For events of a different kind any other kind of partitioning may prove of advantage as well.

The periods between the individual stable recognition signals are partitioned in order to define the window rather the time of activation of a gate circuit 13 which is fed the pulses delivered by a comparator circuit 8.

As mentioned before, the comparator circuit 8 is provided with a reference voltage via the voltage divider 6, which voltage may amount e.g. to 10% of the maximum signal voltage delivered by the peak value register 3. On the other hand, the signal sequence of the sensor 1 delivered by the signal processing circuit 2 is fed to the comparator circuit 8 via the filter 5. If the sensor signal exceeds the reference voltage, comparator circuit 8 will deliver a pulse via its output 14, which will pass the gate circuit 13-provided it has been activated in the manner described above-and may be obtained from a pulse shaping unit 15 at output 16 of the overall device.

In order to keep the pulse from comparator circuit 8, which corresponds to the beginning of the event, within the window defined by gate circuit 13, even in case of major irregularities in the periodicity of the event to be detected via sensor 1, the partitioning circuit 12 of the present variant is designed in such a way as to produce another, wider window, during which time gate 13 is open. In order to prevent any high level noise occurring prior to the beginning of the event to be detected, from producing a pulse in the comparator circuit 8, which passes the activated gate, the stable recognition signal from output 11 of the recognition circuit 4 is fed to the electronic filter 5 as well, where it will be used for modifying the filter time constant by well-known methods, depending on the frequency of the recognition signal. In addition, the partitioning circuit 12 will act upon filter 5 in such a way that different time constants will be provided for the different subintervals between the events to be detected, as defined by the partitioning circuit 12, the time constant during the longer subinterval being big enough to suppress any noise signals during this period, in order to avoid triggering of the comparator circuit 8. Although this will permit an appropriate trigger pulse to be generated even if the events to be detected are subject to relatively strong fluctuations in periodicity, the increased time constant of filter 5 may lead to a minor timing error. This error may be kept at a minimum by varying the time constant of the filter in accordance with the frequency of occurrence of the event to be detected.

Besides, the gate circuit 13 is acted upon by the recognition circuit 4 in such a way that no pulse may pass on the occurrence of the recognition signal until the next window is opened by the partitioning circuit 12. Finally, the pulse delivered by the comparator circuit 8 is prepared for further processing by the pulse shaping unit 15.

I claim:

1. A device for the generation of an electric pulse corresponding to the occurrence in time of an at least approximately periodic event, comprising at least one sensor responding to the occurrence of said event, an evaluation unit connected to said sensor and fed by a sequence of electric signals therefrom, said evaluation unit in turn comprising a recognition circuit for delivering upon arrival of the sensor signals a stable recognition signal uncontaminated by noise, and a gate circuit connected to said recognition circuit and triggered by the occurrence of said recognition signal, the output of said gate circuit producing the pulse corresponding to the occurrence of said periodic event, wherein said evaluation unit further includes a partitioning circuit and a comparator circuit, with the partitioning circuit connected to said gate circuit and being responsive to said recognition circuit for partitioning into subintervals the time interval between the occurrence of two successive recognition signals and said partitioning circuit activating said gate circuit during one of said subintervals which has been predetermined, and wherein the sequence of signals from said sensor is fed to said comparator for transmitting an electric pulse to said gate circuit each time a predetermined signal level has been exceeded, which pulse will be available for further processing upon activation of said gate.

2. A device as in claim 1, wherein said gate circuit is additionally activated during at least one other subinterval of the time elapsing between two recognition signals, which is larger than the first of said subintervals.

3. A device as in claim 2, wherein an electronic filter with a variable time constant is connected between said sensor and said comparator circuit, whose time constant during the additional subinterval for activation of said gate circuit is increased as compared to that given during the first, shorter subinterval.

4. A device as in claim 3, wherein the time constant of said electronic filter is variable in accordance with the frequency of occurrence of said periodic event, at least during the additional, greater subinterval.

* * * * *